(12) United States Patent
Domae et al.

(10) Patent No.: US 6,252,427 B1
(45) Date of Patent: Jun. 26, 2001

(54) CMOS INVERTER AND STANDARD CELL USING THE SAME

(75) Inventors: Shinichi Domae; Tetsuya Ueda, both of Osaka (JP)

(73) Assignee: Matsushita Electronics Corporation, Osaka (JP)

( * ) Notice: Subject to any disclaimer, the term of this patent is extended or adjusted under 35 U.S.C. 154(b) by 0 days.

(21) Appl. No.: 09/333,048

(22) Filed: Jun. 15, 1999

(30) Foreign Application Priority Data

Apr. 27, 1999 (JP) .................................................. 11-119290

(51) Int. Cl.[7] .......................... H03K 19/20; H03K 19/094
(52) U.S. Cl. ............................ 326/121; 326/122; 326/81; 257/204
(58) Field of Search ............................. 326/121, 81, 122, 326/101; 257/204, 202

(56) References Cited

U.S. PATENT DOCUMENTS

| | | | |
|---|---|---|---|
| 4,849,804 | * | 7/1989 | Mader ............................. 257/202 X |
| 4,868,627 | * | 9/1989 | Yamada et al. ........................ 357/42 |
| 5,095,356 | * | 3/1992 | Ando et al. ..................... 257/202 X |
| 5,410,490 | | 4/1995 | Yastrow . |
| 5,598,347 | * | 1/1997 | Iwasaki ............................... 257/798 |

FOREIGN PATENT DOCUMENTS

| | | |
|---|---|---|
| 04-152567 | 5/1992 | (JP) . |
| 08-316323 | 11/1996 | (JP) . |
| 09-293843 | 11/1997 | (JP) . |
| 10-144797 | 5/1998 | (JP) . |
| 10-275910 | 10/1998 | (JP) . |

* cited by examiner

*Primary Examiner*—Huan Hoang
(74) *Attorney, Agent, or Firm*—Eric J. Robinson; Nixon Peabody LLP

(57) ABSTRACT

To prevent a void from being formed in a CMOS inverter due to electromigration.

A power line 11 is connected to the source of a p-channel MOS transistor Tr1 via a first contact 12. A ground line 13 is connected to the source of an n-channel MOS transistor Tr2 via a second contact 14. One terminal of a first output signal line 15 is connected to the drain of the p-channel MOS transistor Tr1 via a third contact 16, while the other terminal thereof is connected to the drain of the n-channel MOS transistor Tr2 via a fourth contact 17. one terminal of a second output signal line 18 is connected to the fourth contact 17, while the other terminal thereof extends toward the output terminal of the inverter. A first path of an input signal line 19 is connected to the gate electrode 20 of the p-channel MOS transistor Tr1 via a fifth contact 21, while a second path thereof is connected to the gate electrode 20 of the n-channel MOS transistor Tr2 via a sixth contact 22.

14 Claims, 8 Drawing Sheets

CMOS INVERTER AND STANDARD CELL USING THE SAME

DETAILED DESCRIPTION OF THE INVENTION

1. Field of the Invention

The present invention relates to a CMOS inverter including p- and n-channel MOS transistors, and a standard cell using the same.

2. Prior Art

In recent years, the number of devices integrated within a single semiconductor large-scale integrated circuit (LSI) has increased by leaps and bounds. Thus, in laying out an LSI, it has become a commonplace to work out an overall design for the LSI by designing a complicated logic circuit using at least one of standard functional circuit blocks often used, which have been registered as standard cells. A standard cell is a combination of logical elements such as NAND and NOR gates, and a basic cell of each logical element is an inverter. Among various types of inverters, a CMOS inverter is particularly advantageous in low power dissipation. Accordingly, a CMOS inverter is widely used as a basic cell in a standard cell.

FIG. 5 is a circuit diagram of a CMOS inverter including p- and n-channel MOS transistors Tr1 and Tr2. An input signal is supplied in common to the respective gates of the p- and n-channel MOS transistors Tr1 and Tr2, and an output signal is sent out through the commonly connected drains of the p- and n-channel MOS transistors Tr1 and Tr2.

FIG. 6 illustrates a planar structure of a conventional CMOS inverter. A power line 101 for supplying a power supply voltage $V_{DD}$ is connected to the source of the p-channel MOS transistor Tr1 via a first contact 102. A ground line 103 for supplying a ground voltage $V_{SS}$ is connected to the source of the n-channel MOS transistor Tr2 via a second contact 104. An output signal line 105 for outputting an output signal $V_{out}$ from the CMOS inverter is connected to the respective drains of the p- and n-channel MOS transistors Tr1 and Tr2 via third and fourth contacts 106 and 107, respectively. An input signal line 108 for inputting an input signal $V_{in}$ to the CMOS inverter is connected to the respective gate electrodes 109 of the p- and n-channel MOS transistors Tr1 and Tr2 via fifth and sixth contacts 110 and 112, respectively.

In this case, the power line 101, ground line 103, output signal line 105 and input signal line 108 are made of aluminum or an aluminum alloy. The power, ground and output signal lines 101, 103 and 105 are connected to the source or drain of the p- or n-channel MOS transistor Tr1 or Tr2, which is formed on the surface of a semiconductor substrate, via a refractory metal such as tungsten for the first, second, third or fourth contact 102, 104, 106 or 107. The input signal line 108 is connected to the gate electrodes 109 of polysilicon via a refractory metal like tungsten for the fifth or sixth contact 110 or 112.

PROBLEMS TO BE SOLVED BY THE INVENTION

In a recent advanced LSI with increased density and number of devices integrated, functional elements and interconnects have been miniaturized as much as one possibly can during laying out the LSI to minimize an increase in chip area. Also, the larger the number of devices integrated, the longer the signal propagation delay on the interconnects, thus interfering with an even higher speed operation of an LSI.

Considering the circumstances such as these, some people began to suggest replacing aluminum, which had heretofore been used as a primary interconnect material because of its excellent processability and stability, with copper with lower electrical resistance (which is less easy to process than aluminum, though).

FIG. 7 illustrates a planar structure of a CMOS inverter designed in response to such a demand. Thanks to the improvement in alignment accuracy, the line width of a portion of a metal interconnect to be connected to a contact is substantially equalized with the width of the contact, so that the CMOS inverter can be downsized. And the metal interconnects are made of copper or a copper alloy.

A high-density LSI was modeled using a CMOS inverter with the structure shown in FIG. 7 as a basic cell, and the reliability thereof was tested. As a result, an interconnection failure, resembling a void formed due to electromigration in a conventional interconnection structure, was also spotted in the interconnection portion of the CMOS inverter. It was also found that in a standard cell composed of a plurality of CMOS inverters, the interconnection failure in the CMOS inverter on the last stage was remarkable.

It was known that electromigration often happens in a long interconnect with a high current density, i.e., a power line, for example. But it was not expected that electromigration should happen in an interconnection region of a CMOS inverter where each line is short and a current density is low. In addition, a copper line was generally believed to be more resistant to electromigration that an aluminum line. Accordingly, it was totally unexpected that a CMOS inverter with the structure shown in FIG. 7 should get involved with the problem of electromigration.

A defective interconnection region of a last-stage CMOS inverter in a standard cell was observed in detail. As a result, it was found that a void had been formed in an interconnection region near a contact to be connected to the source or drain of the p- and n-channel MOS transistors Tr1 and Tr2 as shown in FIGS. 8(a) and 8(b). Specifically, large voids were formed in the power line 101 near the first contact 102 connected to the source of the p-channel MOS transistor Tr1 and in the output signal line 105 near the fourth contact 109 connected to the drain of the n-channel MOS transistor Tr2.

The present inventors looked into the reasons why the voids had been formed only at particular sites in metal interconnects. As a result, we arrived at the following findings.

First, the operating principle of a CMOS inverter will be considered. Referring to the circuit diagram shown in Figure 5, if the input signal $V_{in}$ is high, then the output signal $V_{out}$ is low, because the p-channel MOS transistor Tr1 turns OFF but the n-channel MOS transistor Tr2 turns ON. On the other hand, if the input signal $V_{in}$ is low, then the output signal $V_{out}$ is high, because the p-channel MOS transistor Tr1 turns ON but the n-channel MOS transistor Tr2 turns OFF. While the input signal $V_{in}$ is stabilized at either high or low level, one of the p- and n-channel MOS transistors Tr1 and Tr2 is always OFF. Accordingly, no current flows between the power line 101 and the ground line 103.

However, at the instant the output signal $V_{out}$ changes from low into high, a current flows from the power line 101 toward the output terminal 105a of the output signal line 105 via the p-channel MOS transistor Tr1 as indicated by the arrow A in FIG. 7. On the other hand, at the instant the output signal $V_{out}$ changes from high into low, a current flows from the output terminal 105a of the output signal line 105 toward the ground line 103 via the n-channel MOS transistor Tr2 as indicated by the arrow B in FIG. 7. That is to say, the current flows bidirectionally between a branch point 105b and the output terminal 105a in the output signal line 105, but only unidirectionally between the third contact 106 and the branch point 105b and between the fourth contact 107 and the branch point 105b.

In general, as is well known, when a current flows through a metal interconnect, metal atoms, constituting the metal interconnect, receive the momentum of electrons and move, and a void is formed by the expansion of vacancies, from which the metal atoms have moved. Thus, it is known that electromigration happens in an interconnection region where current flows only unidirectionally, but rarely happens in a region where current flows bidirectionally.

According to the operating principle of the CMOS inverter, the current flows only unidirectionally between the third contact 106 and the branch point 105b and between the fourth contact 107 and the branch point 105b. In other words, electrons move only in the direction indicated by the broken line arrow, i.e., from the branch point 105b toward the power line 101, in the region of the output signal line 105 between the branch point 105b and the power line 101. Similarly, electrons move only in the direction indicated by the broken line arrow, i.e., from the ground line 103 toward the branch point 105b, in the region of the output signal line 105 between the branch point 105b and the ground line 103. Accordingly, electromigration might possibly happen in these regions of the output signal line 105, even though these regions are short.

In addition, in the downsized interconnection structure for a CMOS inverter, the line width of an interconnect is substantially equal to the width of a contact as shown in the cross-sectional view in FIG. 8(b). Thus, in the conventional interconnection structure shown in FIG. 6, a void is less likely to expand in a portion of a metal interconnect, from which electrons flow out through the end of a contact. This is because while the metal atoms are moving in response to the momentum of electrons, the vacancies left by the metal atoms are filled in with those supplied from the regions of the metal interconnect surrounding the contact. In contrast, in the interconnection structure shown in FIG. 7, a void is more likely to expand in that portion of the metal interconnect. This is because while the metal atoms are moving in response to the momentum of the electrons, no metal atoms are supplied from those regions of the metal interconnect surrounding the contact.

Even in an interconnection region where a current flows only unidirectionally, no void is formed in a part of a metal interconnect where electrons move toward the end of a contact. This is because the metal atoms can flow out to nowhere in such a case.

Also, as the density of an LSI has noticeably increased these days, not just the operating speed of an LSI, but the operating frequency of a CMOS inverter have been steeping rising. Accordingly, the density of current flowing through a CMOS inverter per unit time has also been on the rise.

FIG. 9 illustrates respective relationships between the operating frequency of a CMOS inverter and the amount of current flowing through (a unit area of) a power line and between the operating frequency and the amount of current flowing through an output signal line. As can be seen from FIG. 9, the amount of current flowing through the power line or output signal line increases proportionally to the operating frequency. The amount of current flowing through the output signal line is smaller than that flowing through the power line. Thus, when the operating frequency is relatively low, the amount of current flowing through the output signal line does not exceed a permissible current. However, since the operating frequency is very likely to go on rising from now on, the amount of current flowing through an output signal line will someday exceed the permissible current. Thus, it is expected that electromigration on an output signal line would be a serious problem in the near future.

In a standard cell composed of a plurality of CMOS inverters, in particular, a line interconnecting adjacent cells together sometimes has to be long in view of the overall layout, and a large load capacitance is applied to the gate. Accordingly, in such a standard cell, the current flowing through the output signal line of a CMOS inverter on the last stage is larger than the current flowing through the output signal line of any other CMOS inverter. Thus, electromigration is particularly likely to happen in the CMOS inverter on the last stage.

It is generally said that a copper line is more resistant to electromigration than an aluminum line. However, according to a report, since the mechanism of electromigration caused in a copper line is different from that in an aluminum line, electromigration is more likely to happen in a copper line with the smaller line width. Accordingly, a CMOS inverter using a copper line with a narrow line width would expectedly get involved with the problem of electromigration.

To sum up, since the density and operating speed of an LSI will get increasingly high from now on, electromigration, which has been a problem in a power line, for example, is expected to seriously affect a miniaturized CMOS inverter used for designing the LSI of the future.

In view of the foregoing respects, an object of the present invention is providing a CMOS inverter with improved reliability by preventing any void from being formed due to electromigration happening in a miniaturized CMOS inverter.

MEANS FOR SOLVING THE PROBLEMS

The present invention was made based on the findings described above. The technical concept of the present invention lies in eliminating a region where current flows unidirectionally from an area where electrons flow out from a contact into a line.

That is to say, by bringing a branch point on an output signal line of a CMOS inverter to a site in the drain contact of an n-channel MOS transistor, an interconnection region, where electrons flow out from the drain contact into the output signal line, is substantially eliminated.

Specifically, a CMOS inverter according to the present invention includes p- and n-channel MOS transistors. The CMOS inverter further includes: a power line connected to a source region of the p-channel MOS transistor via a first contact; a ground line connected to a source region of the n-channel MOS transistor via a second contact; a first output signal line, one terminal of which is connected to a drain region of the p-channel MOS transistor via a third contact and the other terminal of which is connected to a drain region of the n-channel MOS transistor via a fourth contact; and a second output signal line, one terminal of which is connected to the fourth contact and the other terminal of which extends toward an output terminal of the inverter.

In the CMOS inverter according to the present invention, a current, flowing through the output terminal of the inverter into the second output signal line, is directly supplied to the fourth contact. Thus, electrons and metal atoms, which exist in a portion of the first output signal line near the fourth contact, do not move toward the first output signal line. That is to say, electromigration does not happen in that portion of the first output signal line near the fourth contact. In this case, metal atoms, existing in a portion of the second output signal line near the fourth contact, do move toward the output terminal of the inverter. However, when a current flows from the p-channel MOS transistor toward the output terminal of the inverter, metal atoms move from the output terminal of the inverter toward that portion of the second output signal line near the fourth contact. Accordingly, no void is formed due to electromigration.

The CMOS inverter with such a configuration is preferably used as a last-stage one among a plurality of mutually connected CMOS inverters forming a standard cell together, or as a CMOS inverter connected in parallel to other CMOS inverters at the output terminal thereof.

Also, a line width at a portion of the power line, which is connected to the first contact, is preferably larger than the width of the first contact.

EMBODIMENTS OF THE INVENTION (First Embodiment)

Hereinafter, a CMOS inverter according to a first embodiment of the present invention will be described with reference to FIG. 1.

As shown in FIG. 1, a power line 11 for supplying a power supply voltage $V_{DD}$ is connected to the source of a p-channel MOS transistor Tr1 via a first contact 12. A ground line 13 for supplying a ground voltage $V_{SS}$ is connected to the source of an n-channel MOS transistor Tr2 via a second contact 14.

One terminal of a first output signal line 15 is connected to the drain of the p-channel MOS transistor Tr1 via a third contact 16, while the other terminal thereof is connected to the drain of the n-channel MOS transistor Tr2 via a fourth contact 17.

One terminal of a second output signal line 18 is connected to the fourth contact 17, while the other terminal thereof extends toward the output terminal of the inverter, through which an output signal $V_{out}$ is provided.

An input signal line 19, extending from an input terminal of the inverter through which an input signal $V_{in}$ is supplied, branches out into two paths. One of these two paths is connected to the gate electrode 20 of the p-channel MOS transistor Tr1 via a fifth contact 21, while the other path is connected to the gate electrode 20 of the n-channel MOS transistor Tr2 via a sixth contact 22.

The power line 11, ground line 13, first and second output signal lines 15, 18 and input signal line 19 are made of a metal such as copper or a copper alloy. The gate electrodes 20 are made of polysilicon. The first, second, third, fourth, fifth and sixth contacts 12, 14, 16, 17, 21 and 22 are made of tungsten. A portion of the power line 11 near the first contact 12, a portion of the ground line 13 near the second contact 13 and the first and second output signal lines 15, 18 are all formed to have a line width of 400 nm and a line height of 500 nm. The first, second, third and fourth contacts 12, 14, 16 and 17 are all formed to have a contact width of 400 nm and a contact height of 700 nm. It should be noted that the "contact width" means a side of a square during designing, but is substantially equivalent to a diameter after the fabrication.

If the input signal $V_{in}$ is high, then the output signal $V_{out}$ is low, because the p-channel MOS transistor Tr1 turns OFF, but the n-channel MOS transistor Tr2 turns ON. Conversely, if the input signal $V_{in}$ is low, then the output signal $V^{out}$ is high, because the p-channel MOS transistor Tr1 turns ON, but the n-channel MOS transistor Tr2 turns OFF.

At the instant the output signal $V_{out}$ changes from low into high, a current flows through the first output signal line 15 from the third contact 16 toward the fourth contact 17 as indicated by the arrow E. Then, the current flows through the second input signal line 18 from the fourth contact 17 toward the output terminal of the inverter. On the other hand, at the instant the output signal $V_{out}$ changes from high into low, a current flows through the second output signal line 18 directly into the fourth contact 17 without passing through the first output signal line 15.

In FIG. 1, broken-line arrows indicate directions in which electrons move.

At the instant the output signal $V_{out}$ changes from high into low, electrons move from the fourth contact 17 toward the output terminal of the inverter in the second output signal line 18. However, since current flows through the second output signal line 18 bidirectionally, no void is formed due to electromigration in a portion of the second output signal line 18 near the fourth contact 17.

On the other hand, at the instant the output signal $V_{out}$ changes from low into high, electrons move from the fourth contact 17 toward the third contact 16 in the first output signal line 15. However, metal atoms, flowing together with the electrons, are blocked by the third contact 16, and vacancies left by the metal atoms are filled in with those supplied from the second output signal line 18. Accordingly, no void is formed due to electromigration in a portion of the first output signal line 15 near the fourth contact 17, either.

As in a conventional structure, electromigration happens in a portion of the power line 11 near the first contact 12. In such a case, by increasing the line width of that portion of the power line 11 near the first contact 12, it is possible to prevent a void from being formed. Even if that portion of the power line 11 near the first contact 12 has an increased line width, a signal is not delayed in the power line 11, because there is no variation in voltage in the power line 11.

In the first embodiment, various metal lines, including the power line 11, ground line 13, first and second output signal lines 15, 18 and input signal line 19, are all made of copper or a copper alloy. Alternatively, these lines may be made of aluminum or an aluminum alloy. If an average current density goes on increasing with further decrease in the line width of a metal interconnect or further increase in signal transmission frequency, it is expected that electromigration will happen even in a metal interconnect made of a metal other than aluminum, aluminum alloy, copper and copper alloy. Thus, the type of a metal for the metal interconnects is not especially limited according to the present invention.

In designing a standard cell using a CMOS inverter as a basic cell, the CMOS inverter is ordinarily laid out as shown in FIG. 7. However, the layout for the metal interconnects of the CMOS inverter may be changed depending on the position at which the CMOS inverter is placed. That is to say, the branch point 105b of the output signal line 105 shown in FIG. 7 may be laid out at a position near the drain contact of the n-channel MOS transistor Tr2 (i.e., the fourth contact 104).

However, such a layout change for a metal interconnect is determined depending on the location of the CMOS inverter, not to prevent electromigration. In a standard cell applicable to LSI designing using a CMOS inverter as a basic cell, such a layout change for a metal interconnect is totally different from a technical concept of disposing a CMOS inverter on the last stage or with a large fan-out number as in the first embodiment irrespective of the location thereof.

(Second Embodiment)

Next, a standard cell according to a second embodiment of the present invention will be described with reference to FIGS. 2 and 3.

The CMOS inverter described in the first embodiment does not always have to be applied to all the CMOS inverters used in designing an LSI. An LSI is ordinarily laid out by registering various types of standard functional circuit blocks as standard cells and using several ones of the standard cells in combination. And, in each standard cell, the CMOS inverter is used as the basic cell thereof.

The density of current flowing through a CMOS inverter differs depending on the specific position of the CMOS inverter in a standard cell. Accordingly, it is important to decide where the CMOS inverter of the present invention should be located in a standard cell from a viewpoint of electromigration prevention, which is a primary object of the present invention.

Hereinafter, an exemplary arrangement, in which the CMOS inverter of the present invention is placed within a standard cell, will be described as the second embodiment.

FIG. 2 illustrates a circuit configuration, in which the output terminal of a driver circuit 1 implemented as a first standard cell is connected to the input terminal of a receiver circuit 2 implemented as a second standard cell.

In the driver circuit 1, a plurality of, e.g., three, CMOS inverters are connected in series to each other. The circuit sizes of these CMOS inverters increase in the descending order, i.e., a posterior-stage CMOS inverter is larger in size than an adjacent, anterior-stage CMOS inverter. By increasing the sizes of the CMOS inverters in this manner, the last-stage CMOS inverter can be large enough to drive the receiver circuit 2. Accordingly, a metal interconnect, extending from the output terminal of the last-stage CMOS inverter, is longer and wider than any other metal interconnect connecting adjacent CMOS inverters together. Thus, at the instant an output signal of the last-stage CMOS inverter changes from high into low, a large amount of current flows through the output signal line into the n-channel MOS transistor of the last-stage CMOS inverter.

In the receiver circuit 2, a multiplicity of second CMOS inverters are connected in parallel to the output terminal of a first CMOS inverter, which is connected to the input terminal of the circuit 2. If the fan-out number of the first CMOS inverter is large in this way, then each metal interconnect extending from the output terminal of the first CMOS inverter is long and a large load capacitance is applied to the gate thereof. Thus, at the instant an output signal of the first CMOS inverter changes from high into low, a large amount of current flows into the n-channel MOS transistor of the first CMOS inverter.

FIG. 3 illustrates an H-tree-like structure, in which a metal interconnect 4 extends symmetrically from a clock signal generator circuit 3 implemented as a third standard cell. A functional block 5 is connected to each output terminal of the metal interconnect 4. When the metal interconnect 4 is formed symmetrically, there is no variation in delay among the clock signals arriving at respective functional blocks 5, and clock skewing can be reduced. In such a configuration that the tree-like metal interconnect 4 extends from the clock signal generator circuit 3, a large amount of current also flows into the n-channel MOS transistor of a last-stage CMOS inverter of the clock signal generator circuit 3 at the instant an output signal of the last-stage CMOS inverter changes from high into low.

As described above, a large amount of current flows through the output signal line of the last-stage CMOS inverter in a standard cell, including a plurality of CMOS inverters serially connected together, or through that of a CMOS inverter, to which a multiplicity of CMOS inverters are connected at the output terminal thereof and which has a large fan-out number. Thus, electromigration is ordinarily happens easily on those lines. However, by using the CMOS inverter of the present invention, it is possible to prevent a void from being formed due to electromigration.

(Third Embodiment)

Next, a CMOS inverter according to a third embodiment of the present invention will be described with reference to FIG. 4.

The third embodiment is different from the first embodiment only in the connection relationship between the first and second output signal lines 15 and 18, and the other configuration is common between these two embodiments. Thus, the same components are identified by the same reference numerals as those used in FIG. 1, and the description thereof will be omitted herein.

The third embodiment is characterized in that one terminal of the second output signal line 18 is connected to a portion of the first output signal line 15 near the fourth contact 17 and that the other terminal thereof extends toward the output terminal of the inverter. Accordingly, a current supplied through the output terminal of the inverter flows into the fourth contact 17 substantially without flowing through the first output signal line 15.

At the instant the output signal $V_{out}$ changes from low into high, a current flows through the first output signal line 15 from the third contact 16 toward the fourth contact 17 as indicated by the arrow F. Then, the current flows from a portion of the first output signal line 15 near the fourth contact 17 into the second output signal line 18. On the other hand, at the instant the output signal $V_{out}$ changes from high into low, a current flows through the second output signal line 18 into the fourth contact 17 substantially without passing through the first output signal line 15.

In FIG. 4, a broken-line arrow also indicates a direction in which electrons move.

At the instant the output signal $V_{out}$ changes from high into low, electrons move through the second output signal line 18 from the fourth contact 17 toward the output terminal of the inverter. However, since current flows bidirectionally through the second output signal line 18, no void is formed due to electromigration in a portion of the second output signal line 18 near the fourth contact 17.

On the other hand, at the instant the output signal $V_{out}$ changes from low into high, electrons move from a portion of the first output signal line 15 near the fourth contact 17 toward the third contact 16. However, metal atoms, flowing together with the electrons, are blocked by the third contact 16 and vacancies left by the metal atoms are filled in with those supplied from the second output signal line 18. Accordingly, no void is formed due to electromigration even in a portion of the first output signal line 15 near the fourth contact 17, either.

EFFECTS OF THE INVENTION

If a CMOS inverter according to the present invention is used for an LSI with an increased density or operating speed, no electromigration happens in any metal interconnect of the CMOS inverter. As a result, a highly reliable CMOS inverter is realized, and therefore, a highly reliable LSI can be provided.

Also, by using a CMOS inverter according to the present invention as either a last-stage one among a plurality of mutually connected CMOS inverters, forming a standard cell together, or a CMOS inverter, to which other CMOS inverters are connected in parallel at the output terminal thereof, a highly reliable standard cell, free from electromigration, is realized.

BRIEF DESCRIPTION OF THE DRAWINGS

FIG. 8(a) is a plan view; and

FIG. 8(b) is a cross-sectional view taken along the line viiib—viiib in FIG. 8(a).

DESCRIPTION OF THE REFERENCE NUMERALS

Figure 1:
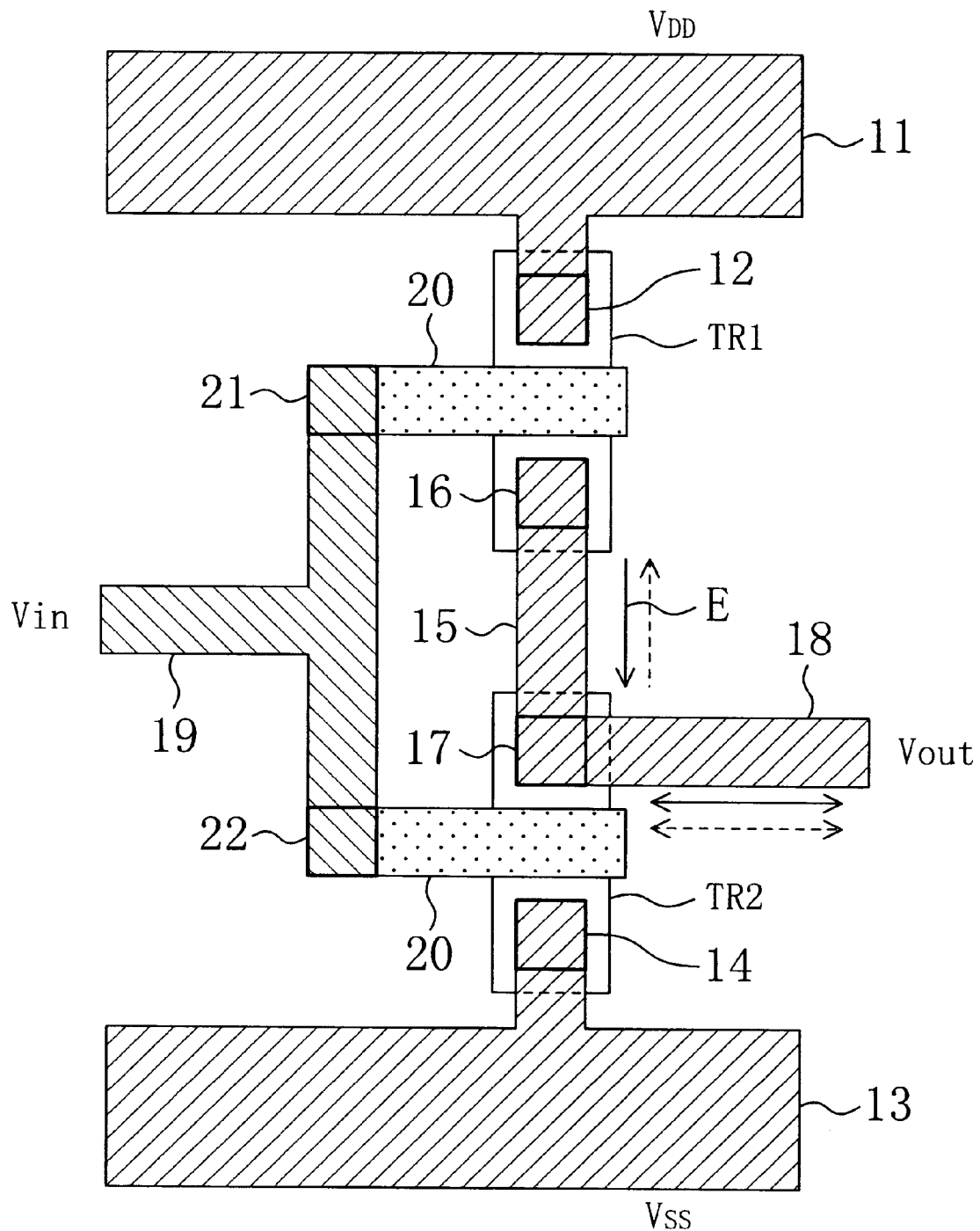
FIG. 1 is a plan view illustrating a CMOS inverter according to a first embodiment of the present invention.
Figure 2:
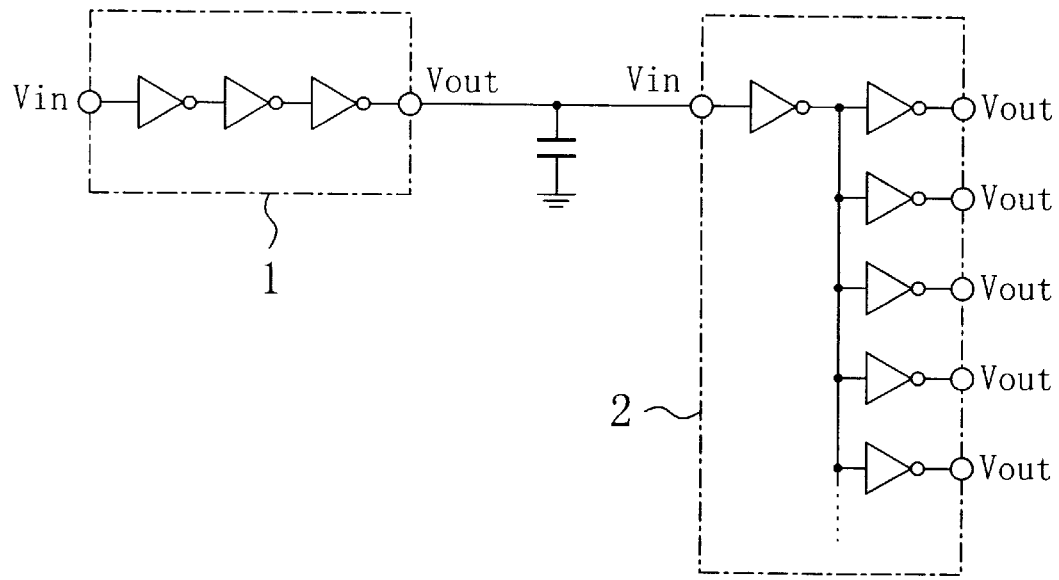
FIG. 2 is a circuit diagram illustrating configurations of first and second standard cells according to a second embodiment of the present invention.
Figure 3:
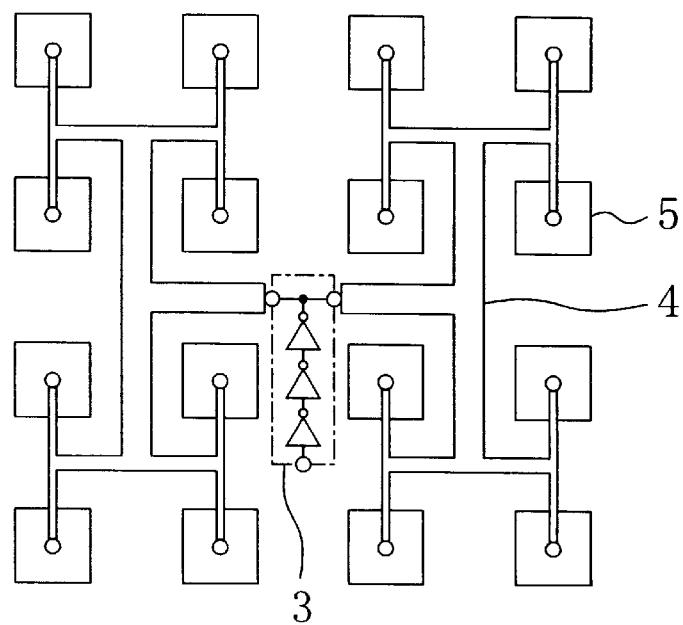
FIG. 3 is a plan view illustrating a clock tree structure, to which a third standard cell is applied according to the second embodiment of the present invention.
Figure 4:
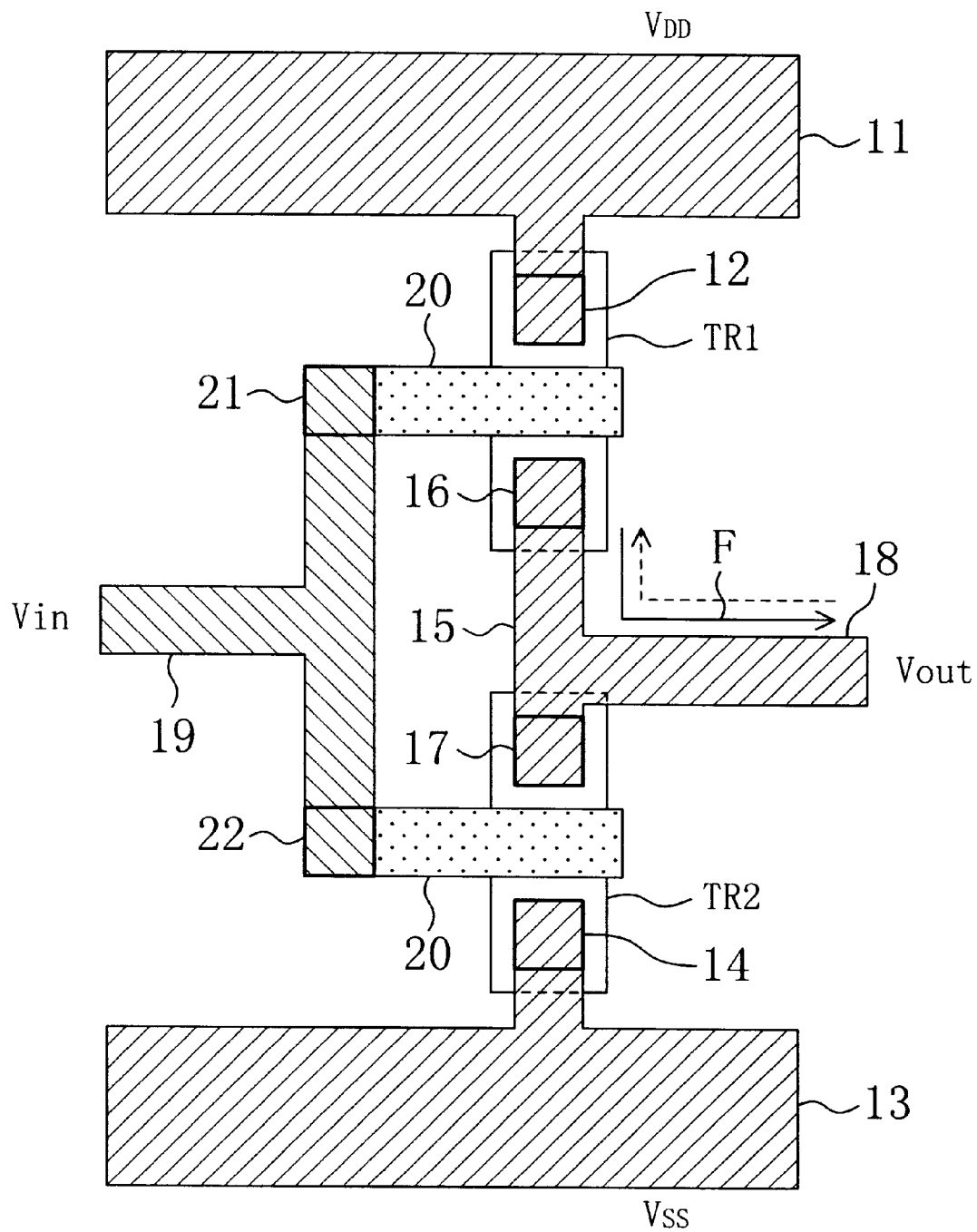
FIG. 4 is a plan view illustrating a CMOS inverter according to a third embodiment of the present invention.
Figure 5:
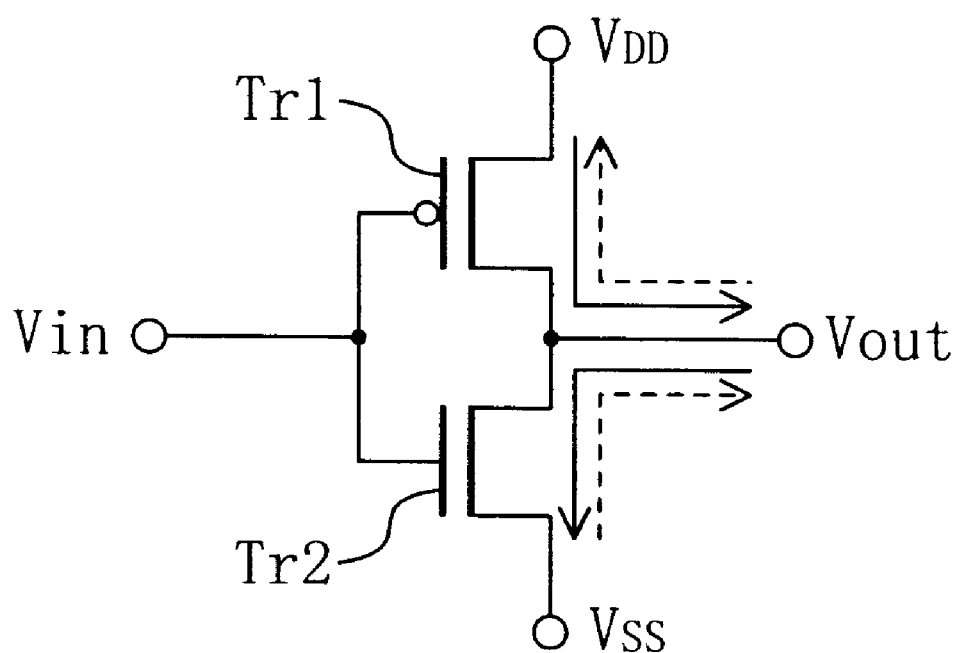
FIG. 5 is a circuit diagram of a CMOS inverter.
Figure 6:
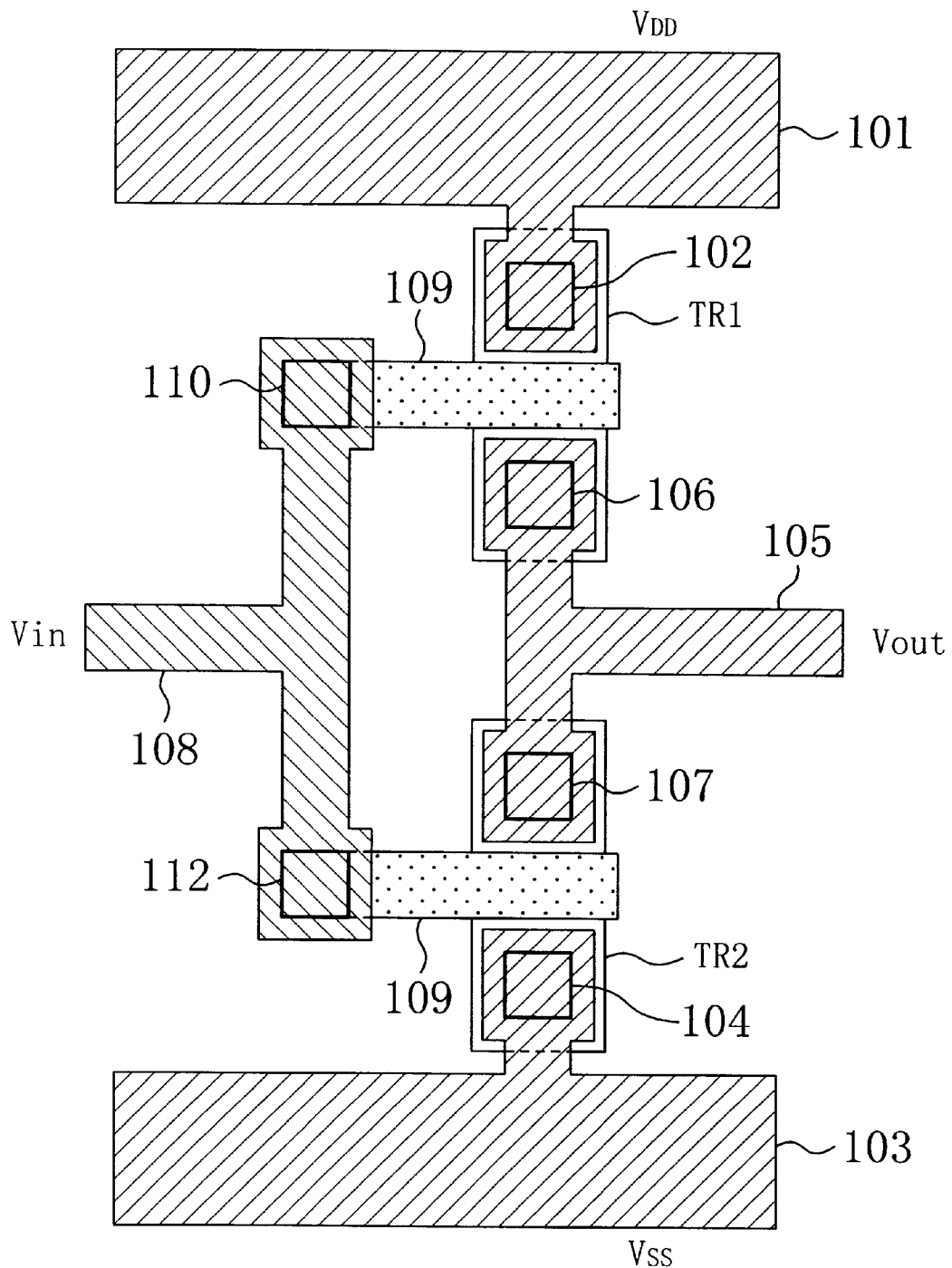
FIG. 6 is a plan view of a CMOS inverter according to a first prior art example.
Figure 7:
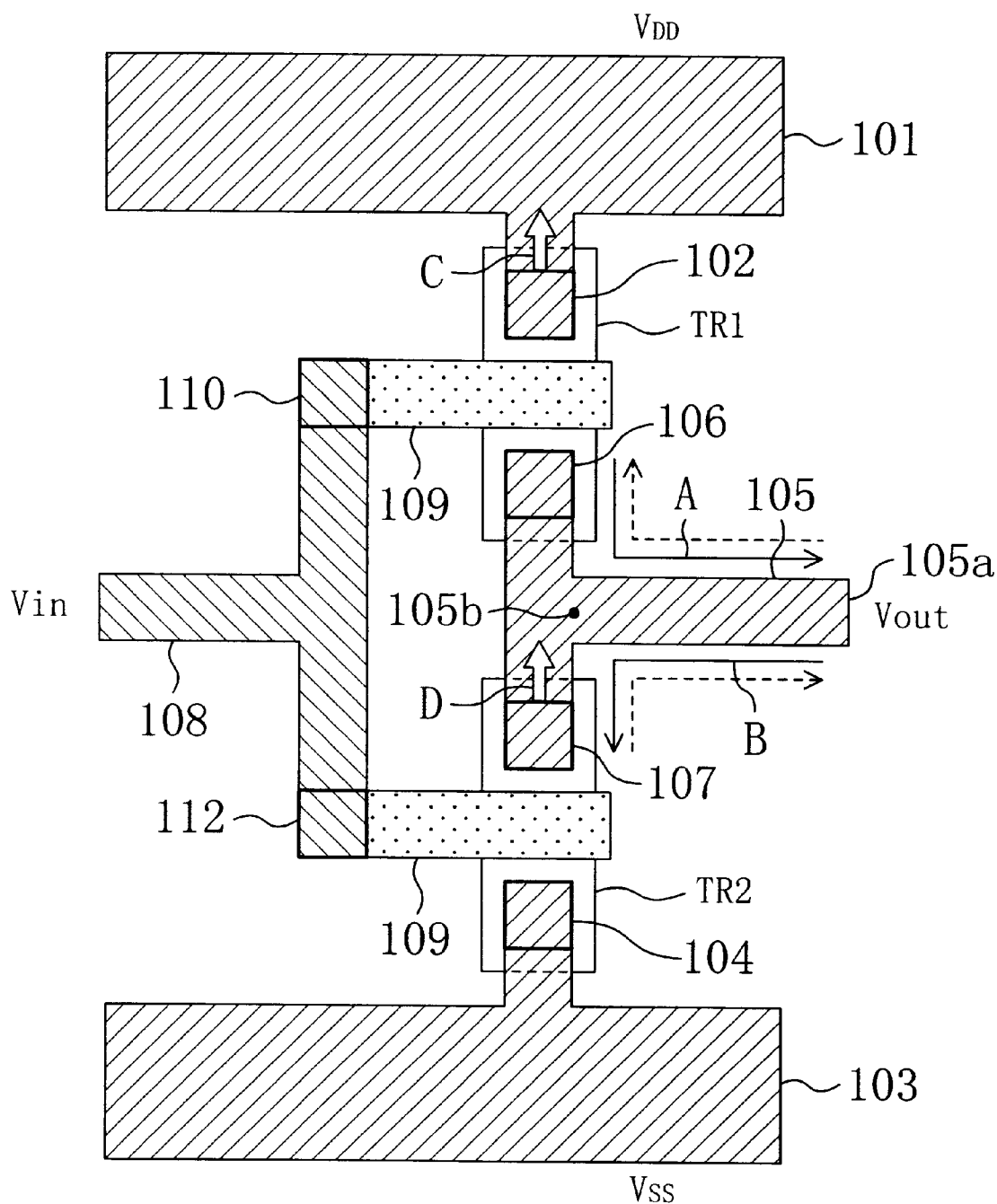
FIG. 7 is a plan view of a CMOS inverter according to a second prior art example.
Figure 8A:
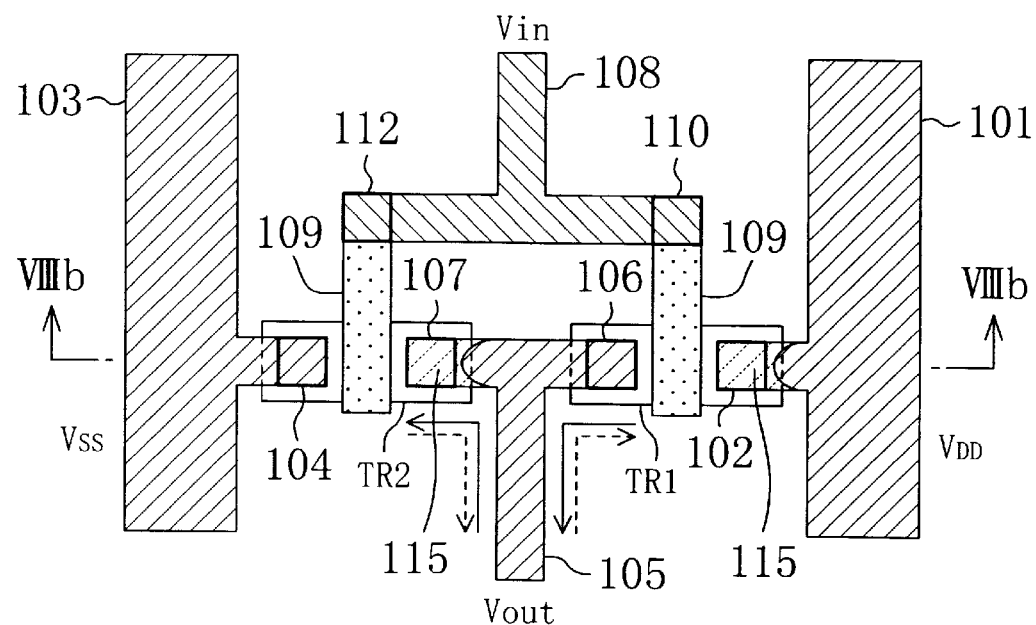
FIGS. 8(a) and 8(b) illustrate where voids are formed in the CMOS inverter according to the second prior art example.
Figure 8B:
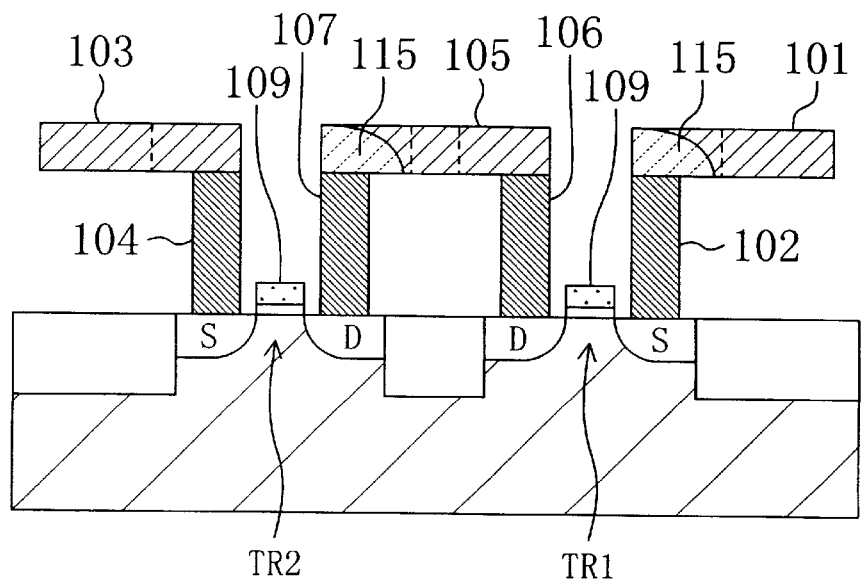
Figure 9:
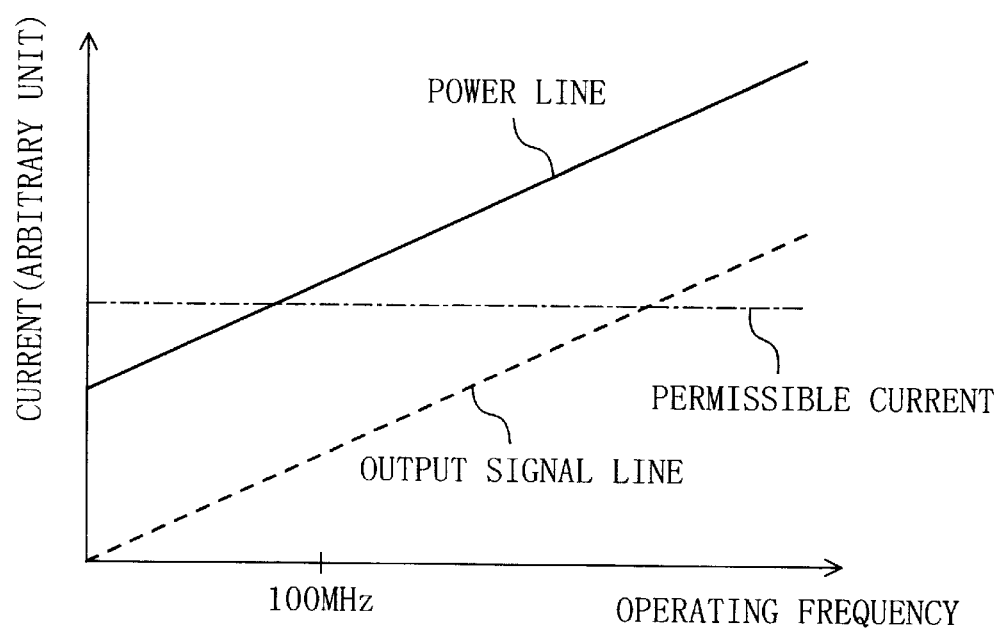
FIG. 9 is a graph illustrating respective relationships between the operating frequency of a CMOS inverter and the amount of current flowing through a power line and between the operating frequency and the amount of current flowing through an output signal line.

Tr1 p-channel MOS transistor
tr2 n-channel MOS transistor
1 driver circuit
2 receiver circuit
3 clock generator circuit
4 metal interconnect
5 functional block
11 power line
12 first contact
13 ground line
14 second contact
15 first output signal line
16 third contact
17 fourth contact
18 second output signal line
19 input signal line
20 gate electrode
21 fifth contact
22 sixth contact

What is claimed is:

1. A CMOS inverter comprising p- and n-channel MOS transistors, characterized by further comprising:

a power line connected to a source region of the p-channel MOS transistor via a first contact;

a ground line connected to a source region of the n-channel MOS transistor via a second contact;

a first output signal line, one terminal of the first output signal line being connected to a drain region of the p-channel MOS transistor via a third contact, the other terminal of the first output signal line being connected to a drain region of the n-channel MOS transistor via a fourth contact; and a second output signal line, one terminal of the second output signal line being connected to the fourth contact, the other terminal of the second output signal line extending toward an output terminal of the inverter.

2. A standard cell made up of a plurality of CMOS inverters that are connected to each other, characterized in that the CMOS inverter as recited in claim 1 is used as a last-stage one of the CMOS inverters.

3. A standard cell made up of a plurality of CMOS inverters that are connected to each other, characterized in that the CMOS inverter as recited in claim 1 is used as one of the CMOS inverters, which is connected in parallel to other ones of the CMOS inverters at the output terminal thereof.

4. The CMOS inverter as recited in claim 1, characterized in that a line width at a portion of the power line, which is connected to the first contact, is larger than the width of the first contact.

5. The CMOS inverter as recited in claim 1, characterized in that a line width at a portion of the ground line, which is connected to the second contact, is substantially equal to the width of the second contact.

6. The CMOS inverter as recited in claim 1, characterized in that the first and second output signal lines are made of copper or a copper alloy.

7. A standard cell made up of a plurality of CMOS inverters that are connected to each other, characterized in that the CMOS inverter used as a last-stage one of the CMOS inverters comprises:

p- and n-channel MOS transistors, characterized in that the CMOS inverter further comprises:

a power line connected to a source region of the p-channel MOS transistor via a first contact:

a ground line connected to a source region of the n-channel MOS transistor via a second contact;

a first output signal line, one terminal of the first output signal line being connected to a drain region of the p-channel MOS transistor via a third contact, the other terminal of the first output signal line being connected to a drain region of the n-channel MOS transistor via a fourth contact; and a second output signal line, one terminal of the second output signal line being connected to a portion of the first output signal line near the fourth contact, the other terminal of the second output signal line extending toward an output terminal of the inverter, and wherein a current flows through the output terminal of the inverter into the fourth contact substantially without flowing through the first output signal line.

8. The standard cell as recited in claim 7 characterized in that the first and second output signal lines are made of copper or a copper alloy.

9. A standard cell made up of a plurality of CMOS inverters that are connected to each other, characterized in that the CMOS inverter used as one of the CMOS inverters, which is connected in parallel to other ones of the CMOS inverters at the output terminal thereof comprises:

p- and n-channel MOS transistors, characterized in that the CMOS inverter further comprises:

a power line connected to a source region of the p-channel MOS transistor via a first contact;

a ground line connected to a source region of the n-channel MOS transistor via a second contact;

a first output signal line, one terminal of the first output signal line being connected to a drain region of the p-channel MOS transistor via a third contact, the other terminal of the first output signal line being connected to a drain region of the n-channel MOS transistor via a fourth contact; and a second output signal line, one terminal of the second output signal line being connected to a portion of the first output signal line near the fourth contact, the other terminal of the second output signal line extending toward an output terminal of the inverter, and wherein a current flows through the output terminal of the inverter into the fourth contact substantially without flowing through the first output signal line.

10. The standard cell as recited in claim 9, characterized in that the first and second output signal lines are made of copper or a copper alloy.

11. A CMOS inverter characterized in that a line width at a portion of the power line, which is connected to a first contact, is larger than the width of the first contact comprises:

p- and n-channel MOS transistors, characterized in that the CMOS inverter further comprises:

a power line connected to a source region of the p-channel MOS transistor via a first contact;

a ground line connected to a source region of the n-channel MOS transistor via a second contact;

a first output signal line, one terminal of the first output signal line being connected to a drain region of the p-channel MOS transistor via a third contact, the other terminal of the first output signal line being connected to a drain region of the n-channel MOS transistor via a fourth contact; and a second output signal line, one terminal of the second output signal line being connected to a portion of the first output signal line near the fourth contact, the other terminal of the second output signal line extending toward an output terminal of the inverter, and wherein a current flows through the output terminal of the inverter into the fourth contact substantially without flowing through the first output signal line.

12. The CMOS inverter as recited in claim 11, characterized in that the first and second output signal lines are made of copper or a copper alloy.

13. A CMOS inverter characterized in that a line width at a portion of the ground line, which is connected to the second contact, is substantially equal to the width of the second contact comprises:

p- and n-channel MOS transistors, characterized in that the CMOS inverter further comprises:

a power line connected to a source region of the p-channel MOS transistor via a first contact;

a ground line connected to a source region of the n-channel MOS transistor via a second contact;

a first output signal line, one terminal of the first output signal line being connected to a drain region of the p-channel MOS transistor via a third contact, the other terminal of the first output signal line being connected to a drain region of the n-channel MOS transistor via a fourth contact; and a second output signal line, one terminal of the second output signal line being connected to a portion of the first output signal line near the fourth contact, the other terminal of the second output signal line extending toward an output terminal of the inverter, and wherein a current flows through the output terminal of the inverter into the fourth contact substantially without flowing through the first output signal line.

14. The CMOS inverter as recited in claim 13, characterized in that the first and second output signal lines are made of copper or a copper alloy.

* * * * *